(12) United States Patent
Kikukawa et al.

(10) Patent No.: US 7,394,744 B2
(45) Date of Patent: Jul. 1, 2008

(54) REPRODUCTION APPARATUS AND INFORMATION RECORDING MEDIUM TESTING APPARATUS

(75) Inventors: Takashi Kikukawa, Tokyo (JP);
Narutoshi Fukuzawa, Tokyo (JP);
Tatsuhiro Kobayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 490 days.

(21) Appl. No.: 11/100,442

(22) Filed: Apr. 7, 2005

(65) Prior Publication Data
US 2005/0226119 A1  Oct. 13, 2005

(30) Foreign Application Priority Data
Apr. 8, 2004  (JP)  ............................. 2004-113932

(51) Int. Cl.
G11B 7/00  (2006.01)
(52) U.S. Cl. ............... 369/59.15; 369/47.26; 369/59.16
(58) Field of Classification Search ............. 369/47.26, 369/59.16, 124.13, 59.15
See application file for complete search history.

(56) References Cited

U.S. PATENT DOCUMENTS

| | | | | |
|---|---|---|---|---|
| 5,247,509 A * | 9/1993 | Nakane et al. | ............... | 369/116 |
| 6,499,084 B2 | 12/2002 | Kobayashi et al. | | |
| 6,614,745 B1 * | 9/2003 | Takeda et al. | .......... | 369/124.13 |
| 7,123,552 B2 * | 10/2006 | Matsui | ..................... | 369/44.13 |
| 2003/0076771 A1 * | 4/2003 | Lin et al. | ............... | 369/124.11 |
| 2004/0240340 A1 | 12/2004 | Tsukamoto et al. | | |
| 2005/0041563 A1 * | 2/2005 | Tawaragi et al. | ....... | 369/124.01 |
| 2005/0157626 A1 * | 7/2005 | Lin et al. | ............... | 369/124.11 |

FOREIGN PATENT DOCUMENTS

| | | |
|---|---|---|
| JP | 8-315369 | 11/1996 |
| JP | 2002-319137 | 10/2002 |
| JP | 2004-087073 | 3/2004 |
| JP | 2005-025900 | 1/2005 |

OTHER PUBLICATIONS

English language Abstract of JP 8-315369
T. Kikukawa et al., "Rigid bubble pit formation and huge signal enhancement in super-resolution near-field structure disk with platinum-oxide layer," Applied Physics Letters, vol. 81, No. 25, pp. 4697-4699 (2002).

(Continued)

Primary Examiner—Wayne Young
Assistant Examiner—LaTanya Bibbins
(74) Attorney, Agent, or Firm—Greenblum & Bernstein, P.L.C.

(57) ABSTRACT

A reproduction apparatus is capable of reproducing information recorded on information recording media including at least a super RENS recording medium. The reproduction apparatus includes: an optical head that receives laser light that has been reflected or transmitted by the information recording medium and photoelectrically converts the laser light to an electric signal; a signal processing circuit that extracts an AC component from the electric signal and attenuates the AC component by a predetermined attenuation; an amplitude controlling circuit that controls an amplitude of an electric signal outputted from the signal processing circuit so as to become a predetermined amplitude; and a reproduction circuit that reproduces information recorded on the medium based on an electric signal outputted from the amplitude controlling circuit. An information recording medium testing apparatus includes the reproduction apparatus and a test information generating circuit that generates test information.

3 Claims, 2 Drawing Sheets

OTHER PUBLICATIONS

Jooho Kim et al., "Super-resolution by elliptical bubble formation with $PtO_x$ and AnInSbTe layers," Applied Physics Letters, vol. 83, No. 9, pp. 1701-1703 (2003).

Jooho Kim et al., "Signal Characteristics of Super-RENS Disk at Blue Laser System," Technical Digest of International Symposium on Optical Memory, pp. 264-265 (2003).

Jooho Kim et al., "Random Pattern Signal Characteristics of Super-REMS Disk at Blue Laser System," Technical Digest of Optical Data Storage Topical Meeting, pp. 273-275 (2004).

T. Kikukawa et al., "Basic properties of Super-RENS disc with platinum-oxide as a mask layer," The Journal of the 63rd Japan Society of Applied Physics Academic Lecture, at Niigata University, vol. 3, p. 1005, together with a partial English language translation of the same (2002).

English Language abstract of JP 2002-319137.

English Language abstract of JP 2004-087073.

English Language abstract of JP 2005-025900.

* cited by examiner

REPRODUCTION APPARATUS AND INFORMATION RECORDING MEDIUM TESTING APPARATUS

BACKGROUND OF THE INVENTION

1. Field of the Invention

The present invention relates to a reproduction apparatus constructed so as to be capable of reproducing information recorded on information recording media including at least a super RENS (super REsolution Near-field Structure) recording medium, and to an information recording medium testing apparatus that includes the reproduction apparatus.

2. Description of the Related Art

In recent years, commercialized DVDs (Digital Versatile Discs) are constructed so that marks with a diameter of just 0.40 µm or thereabouts formed on an information recording medium (an optical recording medium) can be distinguished and reproduced by using an optical head where the wavelength of laser light is in a range of 635 nm to 675 nm, inclusive and the numerical aperture of the objective lens is in a range of 0.59 to 0.66, inclusive to focus the laser light to a spot diameter of just 1 µm or thereabouts. In addition, BD (Blu-ray Discs) are constructed so that marks with a diameter in a range of just 0.138 to 0.160 µm, inclusive can be distinguished and reproduced by using an optical head where the wavelength of laser light is in a range of 390 nm to 420 nm, inclusive and the numerical aperture of the objective lens is in a range of 0.70 to 0.90, inclusive to focus the laser light to a spot diameter of just 0.48 µm or thereabouts, which makes it possible to record data at even higher density.

On the other hand, a so-called super RENS (super REsolution Near-field Structure) recording medium has been proposed in recent years, and research into such medium is presently being conducted. A super RENS recording medium has an optical signal amplifying effect (a "super resolution" effect) of around several tens in magnitude, with this effect making it possible to distinguish and reproduce marks of 0.1 µm and below (that is, marks that are smaller than the reproduction limit for optical reproduction) on a recording medium while using the same optical system as a DVD, a BD, or the like. Since the optical system used for a DVD, a BD, or the like can be used without modification, it is possible to use the construction of a standard optical disc apparatus such as that disclosed by Japanese Laid-Open Patent Publication No. 2002-319137, for example, to realize a reproduction apparatus for reading information recorded on a super RENS recording medium.

When using the circuit construction of the optical disc apparatus disclosed in the above Publication without modification in a reproduction apparatus for a super RENS recording medium, the present inventors discovered the following problem. For a super RENS recording medium, the super resolution effect is initially achieved when laser light with a reproduction power that is extremely high (for example, 2.6 mW to 4.0 mW inclusive for a DVD and 1.0 mW to 3.0 mW inclusive for a BD) compared to the reproduction power for a recording medium such as a DVD or a BD (0.7 mW for a DVD and 0.3 mW for a BW) is irradiated. This means that when the marks recorded on the recording medium are large marks with wide gaps in between the marks as shown by the region W in FIG. 3, the amplitude of an electric signal S1 outputted from an optical head that has received the laser light reflected by the recording medium becomes extremely large as shown in FIG. 3 compared to when laser light of a conventional reproduction power is irradiated. On the other hand, when the marks recorded on the recording medium are small marks with narrow gaps in between as shown in the region X in FIG. 3, the ratio of the DC component to the AC component in the electric signal S1 becomes extremely large, as shown in FIG. 3.

Here, an AGC (Auto Gain Control) circuit that is disposed in front of an A/D converter controls the gain for the electric signal S1 outputted from the optical head to control the amplitude of the electric signal S1 and thereby adjusts the amplitude to an optimal amplitude for the dynamic range of the A/D converter. However, since laser light with an extremely high reproduction power is irradiated onto a super RENS recording medium, as described above the amplitude of the electric signal S1 outputted from the optical head can become extremely large and the ratio of the DC component to the AC component can also become extremely large. For this reason, when the amplitude of the electric signal S1 exceeds the tolerated input limit of the AGC circuit, distortion occurs in the waveform of the electric signal S1 (the reproduction signal) outputted from the AGC circuit, while when the ratio of the DC component of the electric signal S1 is large, gain control by the AGC circuit becomes insufficient, resulting in increased jitter. When the electric signal S1 outputted from the AGC circuit becomes distorted or has increased jitter, it becomes difficult for the A/D converter to favorably carry out conversion to digital data, and it also becomes difficult for a demodulation circuit disposed after the A/D converter to correctly demodulate data based on such digital data. Accordingly, with such reproduction apparatus, there is the problem that it is difficult to correctly reproduce information recorded on a super RENS recording medium.

SUMMARY OF THE INVENTION

The present invention was conceived in view of the problem described above and it is a principal object of the present invention to provide a reproduction apparatus that can correctly reproduce information recorded on a super RENS recording medium. It is a further object to provide an information recording medium testing apparatus that can appropriately test a super RENS recording medium.

A reproduction apparatus according to the present invention is constructed so as to be capable of reproducing information recorded on information recording media including at least a super RENS recording medium, the reproduction apparatus comprising: an optical head that emits laser light set at a reproduction power onto an information recording medium and then receives the laser light that has been reflected or transmitted by the information recording medium and photoelectrically converts the laser light to an electric signal; a signal processing circuit that carries out signal processing for extracting an AC component included in the electric signal and attenuating the AC component by a predetermined attenuation; an amplitude controlling circuit that controls an amplitude of an electric signal outputted from the signal processing circuit so as to become a predetermined amplitude; and a reproduction circuit that reproduces information recorded on the information recording medium based on an electric signal outputted from the amplitude controlling circuit. Here, in terms of characteristics, the expression "super RENS recording medium" for the present invention refers to a recording medium where the CN ratio for marks (recording marks) that are at or below a size limit for reproduction by the applied optical system is at least 30 dB and the reproduction power dependence of the CN ratio of the recording marks at or below the size limit for reproduction is such that when the reproduction power is gradually increased, there is a region where the CN ratio increases by at least +25 dB per 0.5 mW increase in power. On the other hand, in terms of medium structure, a "super RENS recording medium" is a medium with a structure where a layer including metal oxide and a layer including at least antimony (Sb) are laminated with a dielectric layer in between or a medium with a structure where a layer where part of a spot diameter melts due to irradiation with laser light set at the reproduction power and a layer including at least antimony (Sb) are laminated with a dielectric layer in between.

According to this reproduction apparatus, when testing a super RENS information recording medium, even when the amplitude of the electric signal outputted from the optical head that has received the laser light reflected by the super RENS recording medium becomes extremely large or the ratio of the DC component becomes extremely large, the signal processing circuit carries out signal processing that extracts the AC component included in the electric signal outputted from the optical head and attenuates the AC component so that an electric signal with an amplitude that does not exceed the tolerated input limit is always inputted into the amplitude controlling circuit. For this reason, it becomes possible for the amplitude controlling circuit to always carry out amplitude control on the electric signal favorably. Accordingly, the amplitude controlling circuit outputs an electric signal that has low distortion and also favorable jitter to the reproduction circuit, and as a result, it becomes possible for the reproduction circuit to correctly reproduce the information recorded on the information recording medium.

Here, the reproduction apparatus may further include a switching circuit that switches between a first signal path where the optical head and the amplitude controlling circuit are connected via the signal processing circuit and a second signal path where the optical head and the amplitude controlling circuit are connected with the signal processing circuit being bypassed, wherein the amplitude controlling circuit may carryout control so that respective amplitudes of the electric signal inputted via the first signal path and the electric signal inputted via the second signal path become the predetermined amplitude. According to this construction, information recorded on a super RENS recording medium that requires the signal processing circuit and information recorded on a non-super RENS recording medium (i.e., a recording medium with a normal structure) that does not require the signal processing circuit can both-be reproduced correctly.

The optical head may be constructed so as to be capable of emitting the laser light switching between laser light of a reproduction power for the super RENS recording medium and laser light of a reproduction power for a recording medium of a non-super RENS structure, and the reproduction apparatus may further comprise an integrated control circuit that controls the switching circuit to switch to the first signal path when the optical head is caused to emit laser light of a reproduction power for the super RENS recording medium and controls the switching circuit to switch to the second signal path when the optical head is caused to emit laser light of a reproduction power for the recording medium of the non-super RENS structure. By using the above construction, it is possible to automatically switch the switching circuit in accordance with the reproduction power of the laser light emitted from the optical head onto the information recording medium. Accordingly, compared to a construction where the switching of the signal paths in the switching circuit is carried out manually, the switching of the signal paths in the switching circuit in accordance with the reproduction power of the optical head can be carried out correctly and rapidly.

An information recording medium testing apparatus according to the present invention comprises: a reproduction apparatus described above; and a test information generating circuit that generates test information for testing at least one of recording characteristics and reproduction characteristics of the information recording medium based on the information reproduced by the reproduction circuit.

By including a reproduction apparatus described above and a test information generating circuit that generates test information for testing at least one of recording characteristics and reproduction characteristics of the information recording medium based on information reproduced by the reproduction circuit, the information recording medium testing apparatus according to the present invention can have the test information generating circuit correctly generate test information for testing at least one of the recording characteristics and the reproduction characteristics of the information recording medium based on the information of the information recording medium that has been correctly reproduced by the reproduction apparatus. Accordingly, by using such test information, it is possible to correctly test the recording characteristics and the reproduction characteristics of the information recording medium.

It should be noted that the disclosure of the present invention relates to a content of Japanese Patent Application 2004-113932 that was filed on 8 Apr. 2004 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a reproduction apparatus and an information recording medium testing apparatus according to the present invention will now be described with reference to the attached drawings.

First, the construction of an information recording medium testing apparatus 1 will be described with reference to the drawings.

Figure 1:
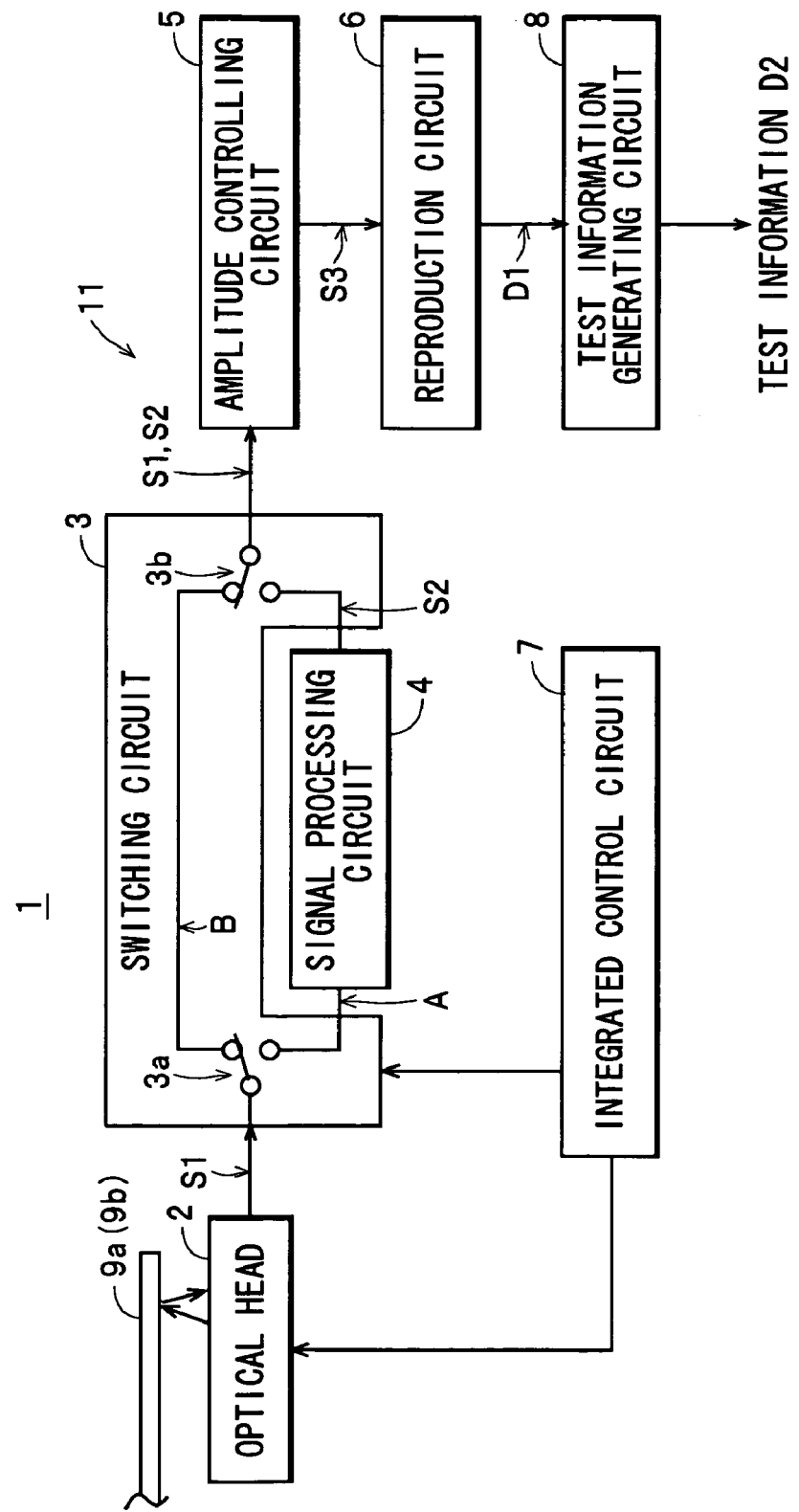
FIG. 1 is a block diagram showing the construction of a testing apparatus.

As shown in FIG. 1, the information recording medium testing apparatus 1 (hereinafter, simply "testing apparatus") includes an optical head 2, a switching circuit 3, a signal processing circuit 4, an amplitude controlling circuit 5, a reproduction circuit 6, an integrated control circuit 7, and a test information generating circuit 8. The testing apparatus 1 is constructed so as to reproduce information D1 recorded on a super RENS recording medium 9a and a recording medium 9b with a non-super RENS structure (hereinafter, both are referred to as "the recording medium 9" when no distinction is required), and is capable of generating test information D2 for testing at least one of recording characteristics and reproduction characteristics for the recording medium 9. In this case, the optical head 2, the switching circuit 3, the signal processing circuit 4, the amplitude controlling circuit 5, the reproduction circuit 6, and the integrated control circuit 7 construct a reproduction apparatus 11 according to the present invention. The reproduction apparatus 11 also includes a rotation mechanism for rotating the recording medium 9 and a head driving mechanism for driving the optical head 2. Neither mechanism is shown in the drawings.

Figure 2:
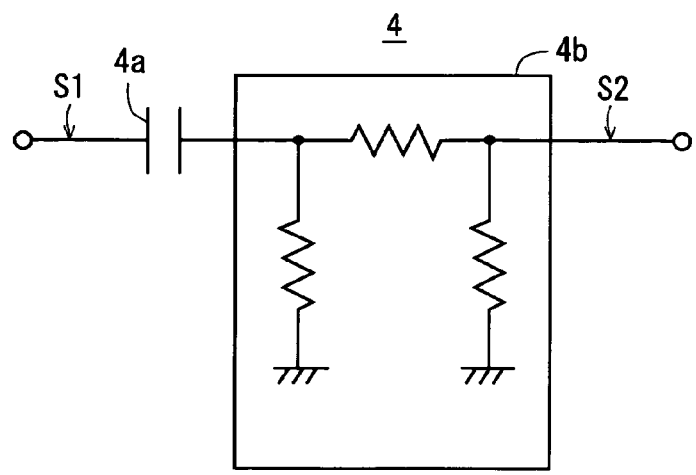
FIG. 2 is a circuit diagram of a signal processing circuit.
Figure 3:
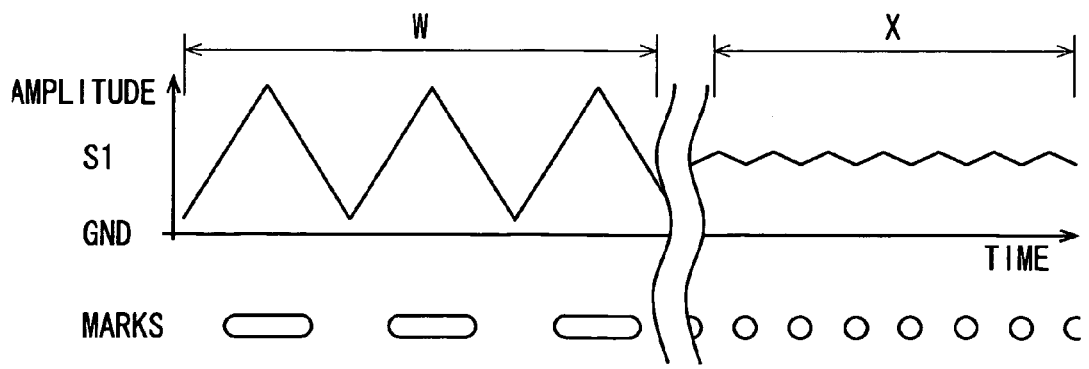
FIG. 3 is a diagram useful in explaining the relationship between marks recorded on a super RENS recording medium and an electric signal generated by an optical head.

The optical head 2 is constructed so as to be capable of irradiating the recording medium 9 switching, in accordance with control by the integrated control circuit 7, between laser light set at a reproduction power for the super RENS recording medium 9a (a high power within a range of 2.6 mW to 4.0 mW, inclusive, for example) and laser light set at a reproduction power for the non-super RENS recording medium 9b that is a standard write-once or rewritable phase-change medium or organic dye medium (a normal power within a range of 0.3 mW to 0.7 mW, inclusive, for example). The optical head 2 also receives laser light that has been reflected or transmitted by the recording medium 9 when the recording medium 9 is irradiated with laser light (in the present embodiment, the light is reflected) and photoelectrically converts the light to an electric signal S1. The switching circuit 3 is constructed of a pair of switches 3a, 3b that are controlled so as to switch together. By operating the switches 3a, 3b under the control of the integrated control circuit 7, the switching circuit 3 switches between a first signal path A where the optical head 2 and the amplitude controlling circuit 5 are connected via the signal processing circuit 4 and a second signal path B where the optical head 2 and the amplitude controlling circuit 5 are directly connected with the signal processing circuit 4 being bypassed. According to this construction, when the switching circuit 3 has switched to the second signal path B, the electric signal S1 inputted into the switching circuit 3 is outputted directly to the amplitude controlling circuit 5 without modification, while when the switching circuit 3 has switched to the first signal path A, the electric signal S1 inputted into the switching circuit 3 is outputted to the signal processing circuit 4 and an electric signal S2, described later, that has been processed by the signal processing circuit 4 is outputted to the amplitude controlling circuit 5. When the electric signal S1 is inputted, the signal processing circuit 4 carries out signal processing that generates the electric signal S2 by extracting the AC component included in the electric signal S1 while removing the DC component and attenuating the signal by a predetermined attenuation. More specifically, as shown in FIG. 2, the signal processing circuit 4 includes a capacitor 4a and an attenuator 4b that is connected in series to the capacitor 4a. Here, the capacity of the capacitor 4a is set at a capacitance (for example, 0.1 µF) that can extract the AC component included in the electric signal S1 while removing the DC component. As one example, the attenuator 4b is constructed of a pi-shaped attenuator where three resistors are connected in the shape of the Greek letter pi. The attenuation of the attenuator 4b is set at a level (10 dB, for example) so that the amplitude of the electric signal S2 does not exceed the tolerated input limit of the amplitude controlling circuit 5. It should be noted that it is possible to use a T-shaped attenuator where three resistors are connected in a "T" shape, or any freely chosen circuit construction, as the attenuator 4b, with the attenuation thereof also being set as desired.

The amplitude controlling circuit 5 is an AGC circuit that controls the gain so that the amplitude of the electric signal S1 or S2 outputted from the switching circuit 3 becomes a predetermined amplitude and outputs the resulting signal as an electric signal S3. The reproduction circuit 6 includes an A/D converter (not shown) and a demodulation circuit, for example, and converts the inputted electric signal S3 to digital data, extracts a clock component from the digital data, and demodulates (reproduces) the information D1 recorded on the recording medium 9 based on the digital data and the clock component. The integrated control circuit 7 includes a CPU or the like, and carries out setting control for the reproduction power of the laser light emitted by the optical head 2 and switching control over the switching circuit 3 for the signal paths A, B. More specifically, when the optical head 2 is caused to emit laser light with the output level of the laser light set at the reproduction power for the super RENS recording medium 9a, the integrated control circuit 7 controls the switching circuit 3 to switch to the first signal path A. On the other hand, when the optical head 2 is caused to emit laser light with the output level of the laser light set at the reproduction power for the non-super RENS recording medium 9b, the integrated control circuit 7 controls the switching circuit 3 to switch to the second signal path B. In addition, the integrated control circuit 7 carries out control over the rotation mechanism that rotates the recording medium 9 and the head driving mechanism that drives the optical head 2. The test information generating circuit 8 generates, based on the information D1 reproduced by the reproduction circuit 6, the test information D2 for testing at least one of the recording characteristics and the reproduction characteristics of the recording medium 9. More specifically, the test information generating circuit 8 generates the test information D2 for testing for jitter, errors, and the like, for example, based on the information D1 (a binary signal, for example).

Next, the operation of the testing apparatus 1 will be described with reference to the drawings.

When testing the super RENS recording medium 9a, the integrated control circuit 7 in the testing apparatus 1 controls the optical head 2 to set the reproduction power of the laser light emitted from the optical head 2 onto the recording medium 9a at the high power. In addition, the integrated control circuit 7 controls the switching circuit 3 so that the signal path from the optical head 2 to the amplitude controlling circuit 5 is switched to the first signal path A. Next, the integrated control circuit 7 operates the rotation mechanism to have the super RENS recording medium 9a rotated. The integrated control circuit 7 also operates the head driving mechanism to have the optical head 2 moved in the radial direction of the recording medium 9a and has the optical head 2 start to emit the laser light onto the recording medium 9a. By doing so, the optical head 2 starts to receive the laser light reflected by the recording medium 9a and to output the electric signal S1.

The switching circuit 3 outputs the inputted electric signal S1 via the switch 3a to the signal processing circuit 4 on the first signal path A. At this time, inside the signal processing circuit 4, the capacitor 4a first removes the DC component included in the electric signal S1 and thereby extracts the AC component included in the electric signal S1. Next, the attenuator 4b attenuates the AC component by the predetermined attenuation to generate the electric signal S2 with an amplitude that does not exceed the tolerated input limit of the amplitude controlling circuit 5 and outputs the electric signal S2 to the switching circuit 3. The switching circuit 3 outputs the electric signal S2 inputted from the signal processing circuit 4 via the switch 3b to the amplitude controlling circuit 5. By controlling the gain, the amplitude controlling circuit 5 automatically adjusts the amplitude of the electric signal S2 so as to become the predetermined amplitude (a fixed amplitude) and outputs the resulting electric signal S2 as the electric signal S3. The reproduction circuit 6 converts the inputted electric signal S3 to a digital signal with an A/D converter (not shown), and then demodulates the signal with a demodulation circuit, thereby reproducing the information D1 recorded on the recording medium 9a. The test information generating circuit 8 generates the test information D2 based on the information D1 and outputs the test information D2.

On the other hand, when testing the non-super RENS recording medium 9b, the integrated control circuit 7 controls the optical head 2 to set the reproduction power of the laser light emitted from the optical head 2 onto the recording medium 9b at the normal power. In addition, the integrated control circuit 7 controls the switching circuit 3 so that the signal path from the optical head 2 to the amplitude controlling circuit 5 is switched to the second signal path B. Next, the integrated control circuit 7 operates the rotation mechanism to have the recording medium 9b rotated. The integrated control circuit 7 also operates the head driving mechanism to have the optical head 2 moved in the radial direction of the recording medium 9b and has the optical head 2 start to emit the laser light onto the recording medium 9b. By doing so, the optical head 2 starts to receive the laser light reflected by the recording medium 9b and to output the electric signal S1.

The switching circuit 3 outputs the inputted electric signal S1 via the switch 3a, the second signal path B, and the switch 3b to the amplitude controlling circuit 5. By controlling the gain, the amplitude controlling circuit 5 automatically adjusts the amplitude of the electric signal S1 so as to become the predetermined amplitude (a fixed amplitude) and outputs the resulting electric signal S1 as the electric signal S3. The reproduction circuit 6 converts the inputted electric signal S3 to a digital signal with an A/D converter (not shown), and then demodulates the signal with a demodulation circuit, thereby reproducing the information D1 recorded on the recording medium 9b. The test information generating circuit 8 generates the test information D2 based on the information D1 and outputs the test information D2.

In this way, according to the testing apparatus 1, when testing the super RENS recording medium 9a, even when the amplitude of the electric signal S1 outputted from the optical head 2 that has received the laser light reflected by the super RENS recording medium 9a becomes extremely large or the ratio of the DC component becomes extremely large, the signal processing circuit 4 carries out signal processing that extracts only the AC component included in the electric signal S1 outputted from the optical head 2 and attenuates the AC component by a predetermined attenuation so that an electric signal S2 with an amplitude that does not exceed the tolerated input limit is always inputted into the amplitude controlling circuit 5. For this reason, it becomes possible for the amplitude controlling circuit 5 to always carry out amplitude control on the electric signal S2 favorably. Accordingly, the amplitude controlling circuit 5 outputs the electric signal S3 that has low distortion and also favorable jitter to the reproduction circuit 6, and as a result, it becomes possible for the reproduction circuit 6 to correctly reproduce the information D1 recorded on the recording medium 9a. By doing so, it becomes possible for the test information generating circuit 8 to correctly generate the test information D2 for testing at least one of the recording characteristics and the reproduction characteristics of the recording medium 9 based on the information D1 of the recording medium 9 that has been correctly reproduced by the reproduction apparatus 11 including the reproduction circuit 6 and the like. Accordingly, by using the test information D2, the recording characteristics and the reproduction characteristics of the recording medium 9 can be correctly evaluated.

Also, according to the testing apparatus 1, since the amplitude controlling circuit 5 carries out control so that the respective amplitudes of the electric signal S2 inputted via the first signal path A and the electric signal S1 inputted via the second signal path B become the predetermined amplitude, the information D1 recorded on the super RENS recording medium 9a that requires the signal processing circuit 4 and the information D1 recorded on the non-super RENS recording medium 9b that does not require the signal processing circuit 4 can both be correctly reproduced.

Also, according to the testing apparatus 1, the integrated control circuit 7 controls the switching circuit 3 to switch to the first signal path A when the optical head 2 has emitted laser light for the super RENS recording medium 9a and controls the switching circuit 3 to switch to the second signal path B when the optical head 2 has emitted laser light for the non-super RENS recording medium 9b, so that the switching circuit 3 can automatically switch in accordance with the reproduction power of the laser light emitted from the optical head 2 onto the recording medium 9. Accordingly, compared to a construction where the switching of the signal paths A and B in the switching circuit 3 is carried out manually, the switching of the signal paths A and B in the switching circuit 3 in accordance with the reproduction power of the optical head 2 can be carried out correctly and rapidly.

It should be noted that the present invention is not limited to the above construction. For example, a construction may be used where the testing apparatus 1 is equipped with a display unit and in addition to testing at least one of the recording characteristics and reproduction characteristics of the recording medium 9 based on the test information D2 outputted from the test information generating circuit 8, the integrated control circuit 7 outputs a test result to the display unit.

What is claimed is:

1. A reproduction apparatus constructed so as to be capable of reproducing information recorded on information recording media including at least a super RENS recording medium, the reproduction apparatus comprising:
   an optical head that emits laser light set at a reproduction power onto an information recording medium and then receives the laser light that has been reflected or transmitted by the information recording medium and photoelectrically converts the laser light to an electric signal;
   a signal processing circuit that carries out signal processing for extracting an AC component included in the electric signal and attenuating the AC component by a predetermined attenuation;
   an amplitude controlling circuit that controls an amplitude of an electric signal outputted from the signal processing circuit so as to become a predetermined amplitude;
   a reproduction circuit that reproduces information recorded on the information recording medium based on an electric signal outputted from the amplitude controlling circuit; and
   a switching circuit that switches between a first signal path where the optical head and the amplitude controlling circuit are connected via the signal processing circuit and a second signal path where the optical head and the amplitude controlling circuit are connected with the signal processing circuit being bypassed,
   wherein the amplitude controlling circuit carries out control so that respective amplitudes of the electric signal inputted via the first signal path and the electric signal inputted via the second signal path become the predetermined amplitude.

2. A reproduction apparatus according to claim 1,
   wherein the optical head is constructed so as to be capable of emitting the laser light switching between laser light of a reproduction power for the super RENS recording medium and laser light of a reproduction power for a recording medium of a non-super RENS structure, and the reproduction apparatus further comprises an integrated control circuit that controls the switching circuit to switch to the first signal path when the optical head is caused to emit laser light of a reproduction power for the super RENS recording medium and controls the switching circuit to switch to the second signal path when the optical head is caused to emit laser light of a reproduction power for the information recording medium of the non-super RENS structure.

3. An information recording medium testing apparatus comprising:
   a reproduction apparatus according to claim 1; and
   a test information generating circuit that generates test information for testing at least one of recording characteristics and reproduction characteristics of the information recording medium based on the information reproduced by the reproduction circuit.

* * * * *